(12) United States Patent
Madurawe

(10) Patent No.: US 7,362,133 B2
(45) Date of Patent: *Apr. 22, 2008

(54) THREE DIMENSIONAL INTEGRATED CIRCUITS

(75) Inventor: Raminda Udaya Madurawe, Sunnyvale, CA (US)

(73) Assignee: Viciciv Technology, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 11/801,739

(22) Filed: May 11, 2007

(65) Prior Publication Data

US 2007/0210830 A1     Sep. 13, 2007

Related U.S. Application Data

(63) Continuation of application No. 10/267,483, filed on Oct. 8, 2002.

(60) Provisional application No. 60/393,763, filed on Jul. 8, 2002, provisional application No. 60/397,070, filed on Jul. 22, 2002.

(51) Int. Cl.
*H03K 19/096* (2006.01)

(52) U.S. Cl. .......................................... 326/38; 326/41

(58) Field of Classification Search ............. 326/37–41
See application file for complete search history.

(56) References Cited

U.S. PATENT DOCUMENTS

| | | | |
|---|---|---|---|
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,191,241 A | 3/1993 | McCollum et al. |
| 5,343,406 A | 8/1994 | Freeman et al. |
| 5,488,316 A | 1/1996 | Freeman et al. |
| 5,563,526 A | 10/1996 | Hastings et al. |
| 5,581,501 A | 12/1996 | Sansbury et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,835,405 A | 11/1998 | Tsui et al. |
| 5,844,422 A | 12/1998 | Trimberger et al. |
| 5,880,598 A | 3/1999 | Duong |
| 5,943,574 A | 8/1999 | Tehrani et al. |
| 5,949,710 A | 9/1999 | Pass et al. |
| 6,018,476 A | 1/2000 | Madurawe et al. |
| 6,097,211 A | 8/2000 | Couts-Martin et al. |
| 6,134,173 A | 10/2000 | Cliff et al. |

(Continued)

OTHER PUBLICATIONS

Ashok K. Sharma, "Programmable Logic Handbook—PLDs, CPLDs, & FPGAs", 1998, pp. 99-171, McGraw-Hill, USA.

*Primary Examiner*—Don P Le
(74) *Attorney, Agent, or Firm*—Tran & Associates

(57) ABSTRACT

In a first aspect, a three-dimensional semiconductor device, wherein: a configurable memory element coupled to a programmable logic circuit to program the logic circuit is positioned substantially above the logic circuit. In a second aspect, a three-dimensional semiconductor device, comprising: a first module layer having a circuit block; and a second module layer positioned substantially above the first module layer, comprising a configuration circuit coupled to the circuit block to program the circuit block.

20 Claims, 8 Drawing Sheets

U.S. PATENT DOCUMENTS

| | | |
|---|---|---|
| 6,191,614 B1 | 2/2001 | Schultz et al. |
| 6,242,767 B1 | 6/2001 | How et al. |
| 6,262,596 B1 | 7/2001 | Schultz et al. |
| 6,275,065 B1 | 8/2001 | Mendel |
| 6,331,784 B1 | 12/2001 | Mason et al. |
| 6,331,789 B2 | 12/2001 | Or-Bach |
| 6,337,579 B1 * | 1/2002 | Mochida ................... 326/41 |
| 6,420,925 B1 | 7/2002 | Fifield et al. |
| 6,426,649 B1 * | 7/2002 | Fu et al. .................... 326/41 |
| 6,448,808 B2 | 9/2002 | Young et al. |
| 6,480,027 B1 | 11/2002 | Ngai et al. |
| 6,496,887 B1 | 12/2002 | Plants |
| 6,504,742 B1 | 1/2003 | Tran et al. |
| 6,515,511 B2 | 2/2003 | Sugibayashi et al. |
| 6,525,953 B1 | 2/2003 | Johnson |
| 6,551,857 B2 * | 4/2003 | Leedy ..................... 438/109 |
| 6,582,980 B2 | 6/2003 | Feldman et al. |
| 6,613,611 B1 | 9/2003 | How et al. |
| 6,614,259 B2 | 9/2003 | Couts-Martin et al. |
| 6,627,985 B2 | 9/2003 | Huppenthal et al. |
| 6,737,675 B2 | 5/2004 | Patel et al. |
| 6,738,962 B1 | 5/2004 | Flaherty et al. |
| 6,781,226 B2 * | 8/2004 | Huppenthal et al. ........ 257/686 |
| 6,798,240 B1 | 9/2004 | Pedersen |
| 2001/0003428 A1 | 6/2001 | Or-Bach |
| 2001/0028059 A1 | 10/2001 | Emma et al. |
| 2001/0047509 A1 | 11/2001 | Mason et al. |
| 2002/0186044 A1 | 12/2002 | Agrawal et al. |
| 2003/0001615 A1 | 1/2003 | Sueyoshi et al. |
| 2003/0023762 A1 | 1/2003 | Dhir et al. |
| 2003/0085733 A1 | 5/2003 | Pugh et al. |

* cited by examiner $O_1 = A*B*/C + /A*B$
$O_2 = /A*B + /B*C$
$O_3 = A*B*/C + /A*B + C$
$O_4 = C$

THREE DIMENSIONAL INTEGRATED CIRCUITS

This application is a continuation of application Ser. No. 10/267,483 filed on Oct. 8, 2002 which claims priority from Provisional App. Ser. No. 60/393,763 filed on Jul. 8, 2002 and Provisional App. Ser. No. 60/397,070 filed on Jul. 22, 2002, all of which have as inventor Mr. R. U. Madurawe and the contents of which are incorporated-by-reference.

This application is related to application Ser. No. 10/267,484 (now abandoned) and application Ser. No. 10/267,511 (now U.S. Pat. No. 6,747,478), both of which filed on Oct. 8, 2002 and list as inventor Mr. R. U. Madurawe, the contents of which are incorporated-by-reference.

This application is also related to application Ser. No. 10/846,699 (now U.S. Pat. No. 7,112,994) filed on May 17, 2004, application Ser. No. 10/937,828 filed Sep. 10, 2004, application Ser. No. 10/988,396 filed on Nov. 15, 2004, application Ser. No. 11/357,145 filed on Feb. 21, 2006, application Ser. No. 11/365,031 filed on Mar. 02, 2006, application Ser. No. 10/846,698 (now U.S. Pat. No. 7,064,018) filed on May 17, 2004, application Ser. No. 10/691,013 (now U.S. Pat. No. 7,129,744) filed on Oct. 23, 2003, application Ser. No. 10/727,170 (now U.S. Pat. No. 7,030,651) filed on Dec. 04, 2003, all of which list as inventor Mr. R. U. Madurawe, the contents of which are incorporated-by-reference.

This application is further related to application Ser. No. 10/413,808 (now abandoned) filed on Apr. 14, 2003, application Ser. No. 10/762,627 (now U.S. Pat. No. 7,018,875) filed on Jan. 23, 2004, application Ser. No. 10/413,809 (now U.S. Pat. No. 6,855,988) filed on Apr. 14, 2003, application Ser. No. 10/413,810 (now U.S. Pat. No. 6,828,689) filed on Apr. 14, 2003, all of which list as inventor Mr. R. U. Madurawe, the contents of which are incorporated-by-reference.

BACKGROUND

The present invention relates to multi-dimensional integrated circuits.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. Further, should bugs exist in the custom or semi-custom ICs, the design/fabrication cycle has to be repeated, further aggravating the time to market and engineering cost As a result, ASICs serve only specific applications and are custom built for high volume and low cost applications.

Another type of semi custom device called a Gate Array customizes modular blocks at a reduced NRE cost by synthesizing the design using a software model similar to the ASIC. The missing silicon level design verification results in multiple spins and lengthy design iterations.

In recent years there has been a move away from custom or semi-custom ICs towards field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late en in the product design cycle. It is only for high volume production runs that there is a cost benefit in using the more traditional approaches. However, the conversion from an FPGA implementation to an ASIC implementation typically requires a complete redesign. Such redesign is undesirable in that the FPGA design effort is wasted.

Compared to PLD and FPGA, an ASIC has hard-wired logic connections, identified during the chip design phase, and need no configuration memory cells. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage).

There is no convenient migration path from a PLD or FPGA used as a design verification and prototyping vehicle to the lower die size ASIC. All of the SRAM or Anti-fuse configuration bits and programming circuitry has no value to the ASIC. Programmable module removal from the PLD or FPGA and the ensuing layout and design customization is time consuming with severe timing variations from the original design.

SUMMARY

In one aspect, a three-dimensional semiconductor device includes a first module layer having a plurality of circuit blocks; and a second module layer positioned substantially above the first module layer, including a plurality of configuration circuits to control a portion of the circuit blocks.

Implementations of the above aspect may include one or more of the following. The configuration circuits can be memory elements. Each memory element can be a transistor or a diode or a group of electronic devices. The memory elements can be thin film devices such as thin film transistors (TFT) or diodes. The memory element can be selected from the group consisting of volatile or non volatile memory elements. The memory element can also be selected from the group of fuses, antifuses, SRAM cells, DRAM cells, metal optional links, EPROMs, EEPROMs, flash, and ferro-electric elements. One or more redundant memory cells can be provided for controlling the same circuit block. A third module layer can be formed substantially above the first and second module layer, wherein interconnect and routing signals are formed to connect the circuit blocks within the first and second module layers. The third module layer can be formed substantially below the first and second module layer. Alternatively, third and fourth module layers, wherein interconnect and routing signals are formed can be positioned above and below the second module layer respectively. The circuit block can contain a programmable logic block which responds to input data signals and develops corresponding complete or partial output logic signals, and registers to store the logic signals and either outputting them to output terminals or returning them as inputs to additional programmable logic blocks. The programmable logic blocks can contain pass gate logic, multiplexer logic, truth table logic, or AND/OR logic blocks.

Implementations of the above aspect may further include one or more of the following. The memory can be implemented using a TFT process technology that contains one or more of replaceable Fuses, Anti-fuses and SRAM elements. The process implementation is possible with any process technology where EPROM, EEPROM, Flash, Ferro-Electric or any other programmable element is vertically integrated.

In a second aspect, a multi-dimensional semiconductor device includes a first module layer having a plurality of circuit blocks formed on a first plane; and a second module layer formed on a second plane, including a plurality of configuration circuits formed to control a portion of the circuit blocks.

In a third aspect, a system includes a processor; data storage devices coupled to the processor; and a three-dimensional semiconductor device coupled to the processor, the 3D semiconductor device having a first module layer having a plurality of circuit blocks formed on a first plane and a second module layer formed on a second plane, including a plurality of configuration circuits formed to control a portion of the circuit blocks.

In a fourth aspect, a multi-dimensional semiconductor device includes a plurality of circuit blocks formed on a substrate; and a plurality of configuration circuits formed substantially above the substrate to control at least one circuit block.

Implementation of the fourth aspect may include one or more of the following. The configuration circuit includes a predetermined conductive pattern to control the circuit blocks. The configuration circuits can be memory elements with one device selected from the following: diode, transistor, thin film device, thin film resistor, thin film capacitor, thin film transistor (TFT). The memory element can be selected from the group consisting of volatile or non volatile memory elements. The memory element can also be selected from a group of fuse links, antifuse capacitors, SRAM cells, DRAM cells, metal optional links, EPROM cells, EEPROM cells, flash cells, and ferro-electric elements.

Implementations of the above aspects may include one or more of the following. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks.

A series product families can be provided with a modularized programmable element in an FPGA version followed by a turnkey custom ASIC with the same base die with 1-2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

Advantages of the IC may include one or more of the following. An easy turnkey customization of an ASIC from an original smaller PLD or FPGA would greatly enhance time to market, performance, low cost and better reliability.

DESCRIPTION

Figure 1:
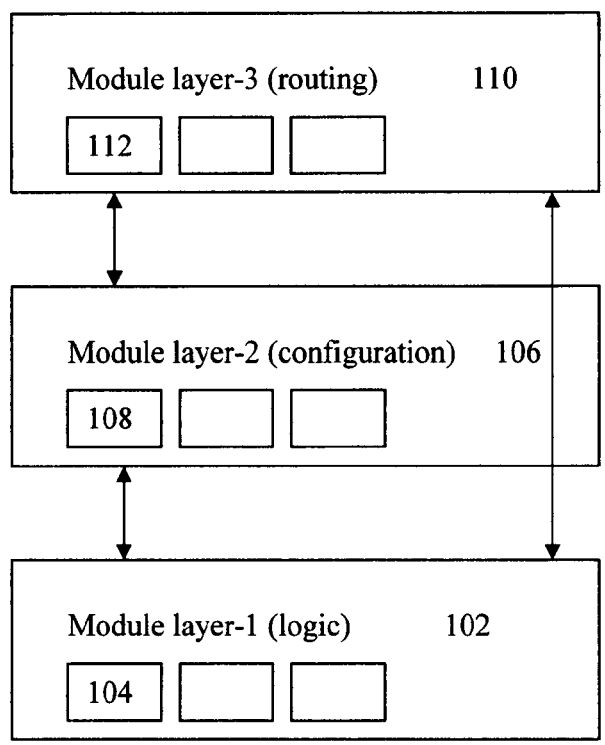
FIG. 1 shows a cross sectional view of a first embodiment of an integrated circuit.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term module layer includes a structure that is fabricated using a series of predetermined process steps. The boundary of the structure is defined by a first step, one or more intermediate steps, and a final step. The resulting structure is formed on a substrate.

The term configuration circuit includes one or more configurable elements and connections that can be programmed for controlling one or more circuit blocks in accordance with a predetermined user-desired functionality. In one embodiment, the configuration circuits include a plurality of memory circuits to store instructions to configure an FPGA. In another embodiment, the configuration circuits include a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate.

FIG. 1 shows a cross sectional view of a first embodiment of an integrated circuit that can be selectably fabricated as either an FPGA or an ASIC. In this embodiment, a three-dimensional semiconductor device 100 is shown. The device 100 includes a first module layer 102 having a plurality of circuit blocks 104 embedded therein. The device 100 also includes a second module layer 106 formed substantially above the first module layer 102. One or more configuration circuits 108 are formed to store instructions to control a portion of the circuit blocks 104. In the embodiment of FIG. 1, wiring/routing circuits 112 are formed on a third layer 110 above the second layer 106. Circuits 112 connect to both circuits 104 and 108 to complete the functionality of the PLD.

Figure 2:
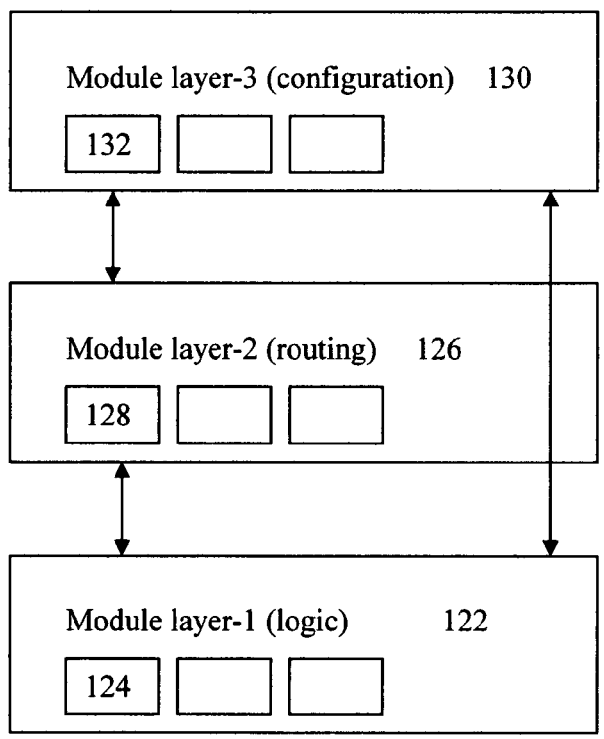
FIG. 2 shows a cross sectional view of a second embodiment of an integrated circuit.

FIG. 2 shows a cross sectional view of a second embodiment of an integrated circuit that can be selectably fabricated as either an FPGA or an ASIC. In this embodiment, a three-dimensional semiconductor device 120 is shown. The device 120 includes a first module layer 122 having a plurality of circuit blocks 124 embedded therein. The device 120 also includes a second module layer 126 formed substantially above the first module layer 122 that includes wiring and/or routing circuitry 128, and a third module layer 130 formed substantially above the second module layer 126 that includes configuration circuits 132. The wiring/routing circuitry 128 is electrically connected to the circuit blocks 124 and to configuration circuits 132 in the third module layer 130. The configuration circuits 132 store instructions to control a portion of the circuit blocks 124.

Figure 3:
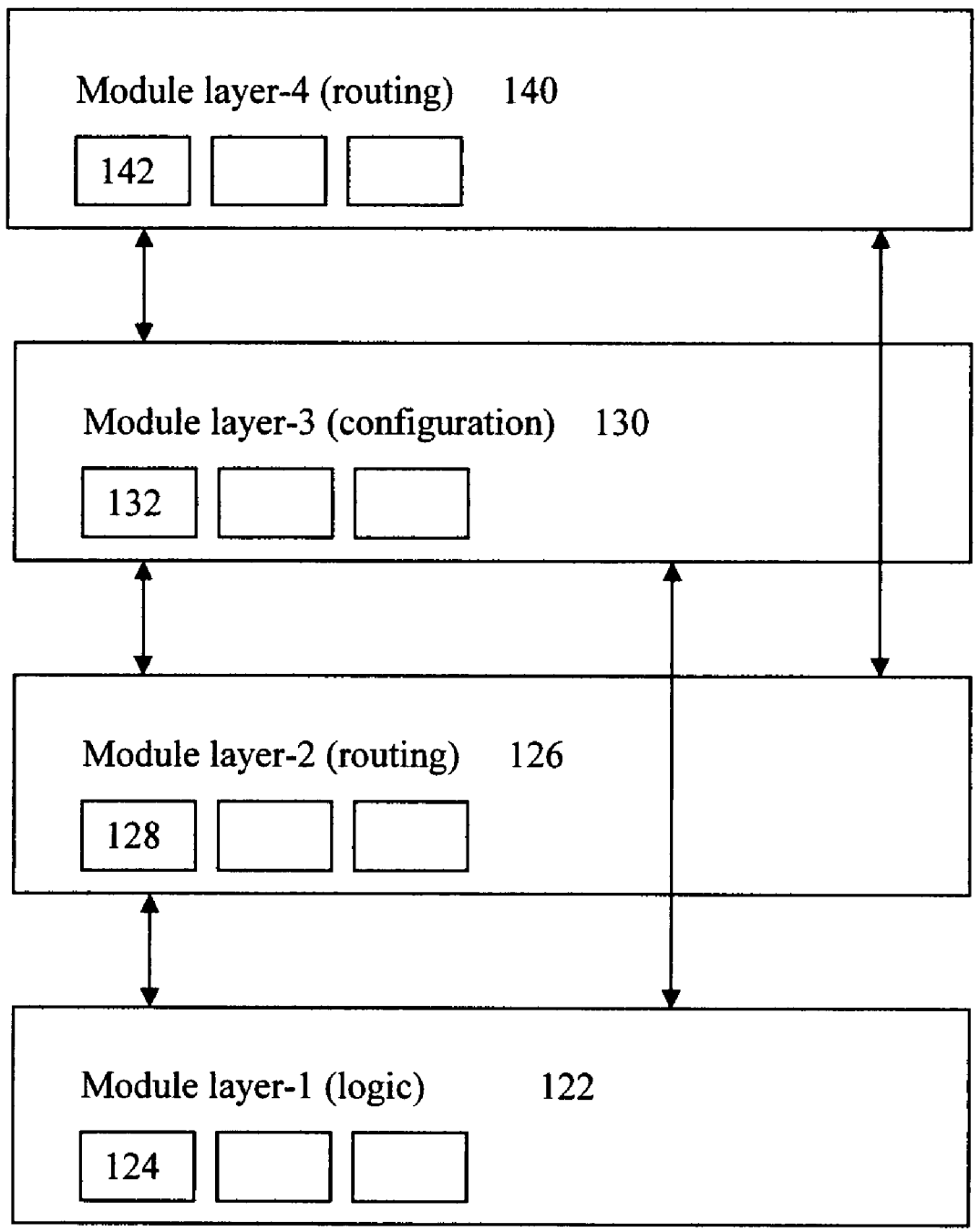
FIG. 3 shows a cross sectional view of a third embodiment of an integrated circuit.

FIG. 3 shows a third embodiment which is substantially similar to the embodiment of FIG. 2. In the embodiment of FIG. 3, a fourth layer 140 having wiring/routing circuitry 142 is position above the third layer 130. The wiring/routing circuitry 142 is electrically connected to one of the following: one or more circuit blocks 124, one or more wiring/routing circuitry 128, and one or more configuration circuits 132.

Figure 4:
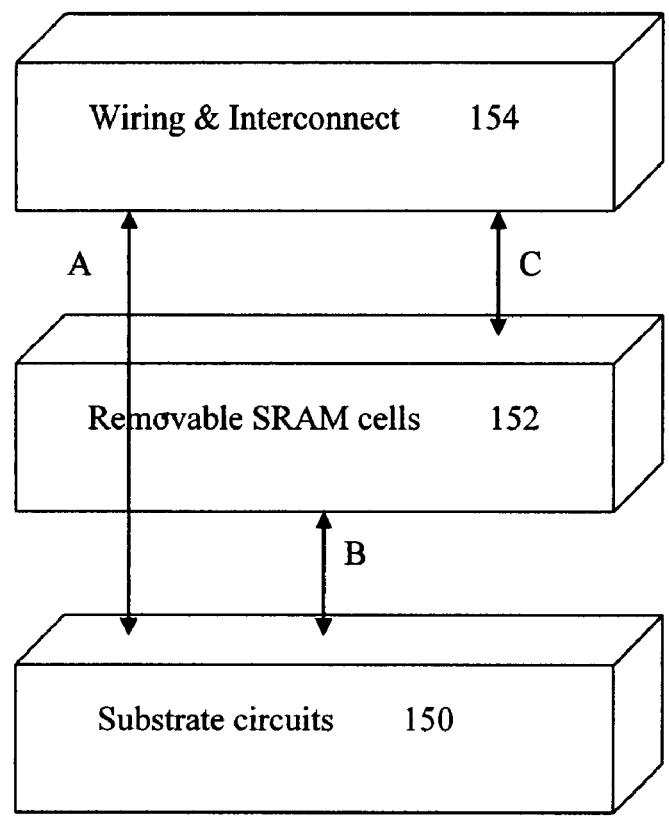
FIG. 4 shows a cross sectional view of a fourth embodiment of an integrated circuit.

FIG. 4 shows one implementation where the configuration memory element is SRAM. First, silicon transistors 150 are deposited on a substrate. A module layer of removable SRAM memory cells 152 are positioned above the silicon transistors 150, and a module layer of interconnect wiring or routing circuit 154 is formed above the removable memory cells 152. To allow this replacement, the design adheres to a hierarchical layout structure. As shown in FIG. 4, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most layer satisfying the same device and routing constraints.

Fabrication of the IC also follows a modularized device formation. Formation of transistors 150 and routing 154 is by utilizing a standard logic process flow used in the ASIC fabrication. Extra processing steps used for memory element 152 formation are inserted into the logic flow after circuit layer 150 is constructed. A full disclosure of the vertical integration of the TFT module using extra masks and extra processing is in the co-pending incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the co-pending incorporated by reference applications discussed above.

In FIG. 4, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed to store instructions to control a portion of the circuit blocks.

Next, details of the circuit blocks 104, the configuration circuit 108, and the wiring and/or routing circuit 112 in FIG. 1 are detailed.

Figure 5:
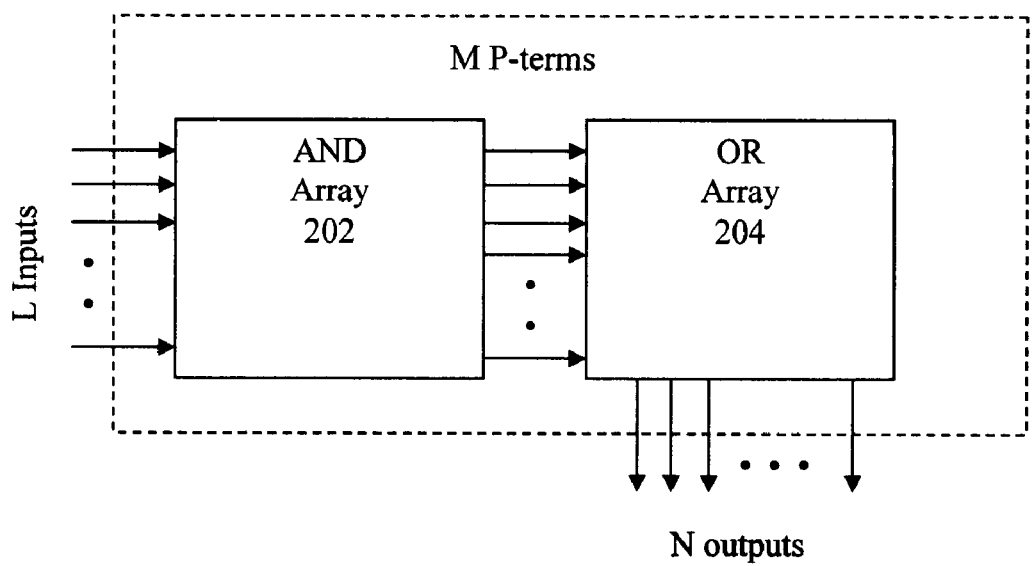
FIG. 5 shows an exemplary AND-OR PLD Architecture.
Figure 6:
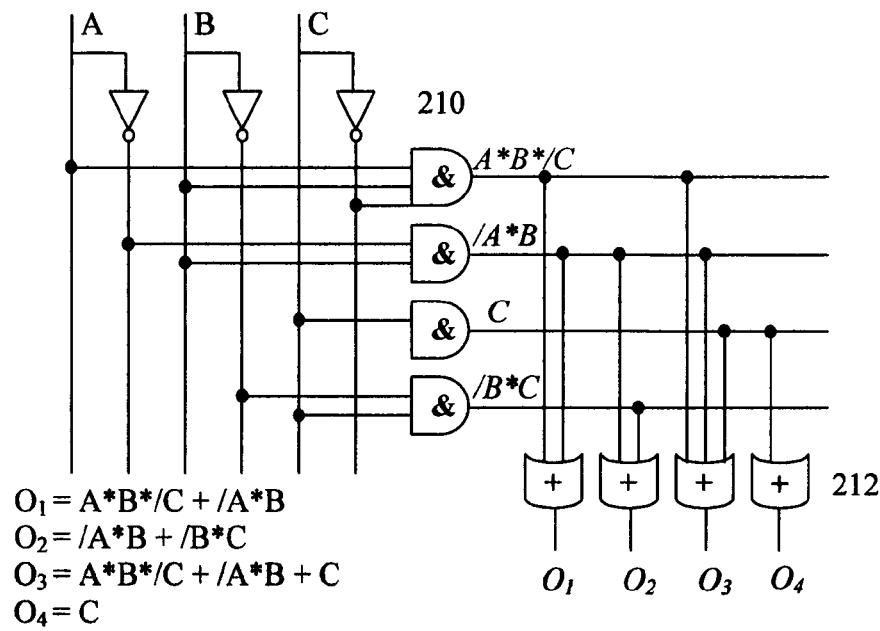
FIG. 6 shows an exemplary AND-OR array gate realization of PLD.

A variety of digital or analog circuits can be used in circuit blocks 104. These circuit blocks include programmable logic blocks to allow user customization of logic. In one embodiment, programmable logic blocks are provided to respond to input data signals. The programmable logic blocks develop corresponding complete or partial output logic signals. Registers are used to store the output logic signals and either outputting them to output terminals or returning them as inputs to additional programmable logic blocks. The registers themselves can be programmable, allowing those to be configured such as T flip-flops, JK flip-flops, or any other register. The logic blocks may contain no registers, or the registers may be programmed to be by-passed to facilitate combinational logic implementation. The programmable logic block can be selected from one of a pass gate logic, a multiplexer logic, a truth table logic, or an AND/OR logic. FIG. 5 shows an exemplary AND-OR PLD Architecture. AND and OR arrays 202 and 204 contain user configurable programmable elements. FIG. 6 shows an exemplary AND-OR array gate realization of a three input, four P-term, four output PLD. The AND and OR array 210-212 are shown programmed to a specific pattern.

Figure 7:
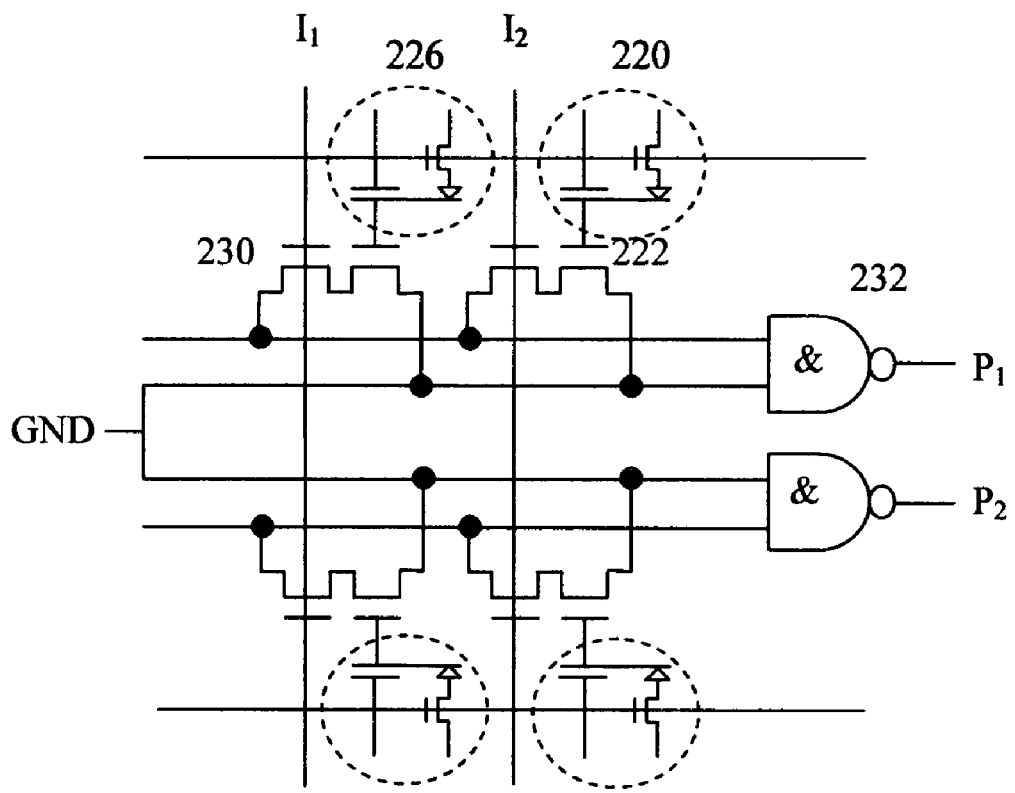
FIG. 7 shows one EEPROM implementation of a P-Term logic array.
Figure 8:
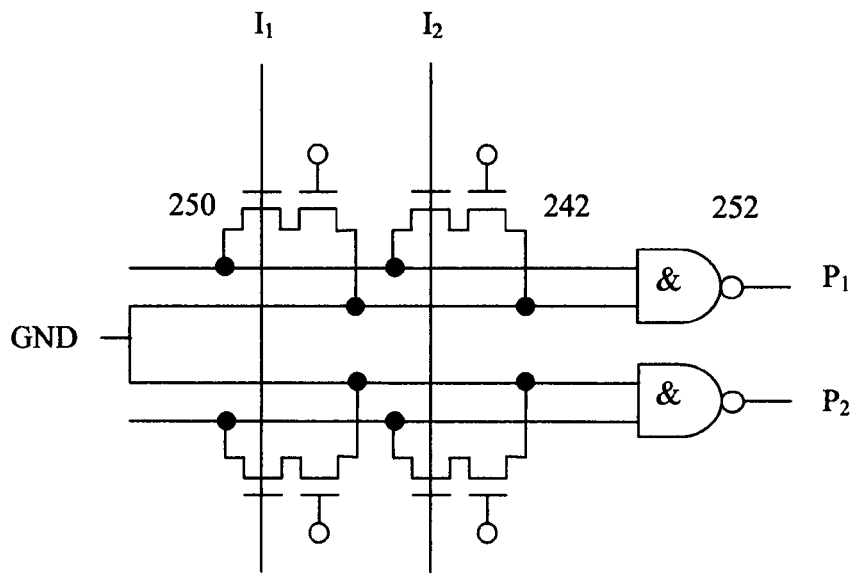
FIG. 8 shows P-term configuration for SRAM/hard-wired PLD architecture.

In yet other embodiments, the circuit block 104 contains a RAM/ROM logic block consisting of "logic element tree" or "P-Term logic array" blocks that perform logic functions. FIG. 7 shows one such NAND EEPROM implementation of a P-Term in NAND-NOR logic array, while FIG. 8 shows the same P-term configuration for either SRAM, or hard-wired PLD architectures. FIG. 7 shows two mirrored outputs P1 and P2. For output P1, an AND gate 232 receives signals from pass transistors 222, 224, 228 and 230. The pass transistor 222 is controlled by block 220 shown in the dashed circle, while the pass transistor 228 is controlled by block 226 shown inside the dashed circle. Similarly, the upper half of FIG. 8 includes an AND gate 252 that receives inputs from pass transistors 242, 244, 248 and 250, respectively.

Figure 9:
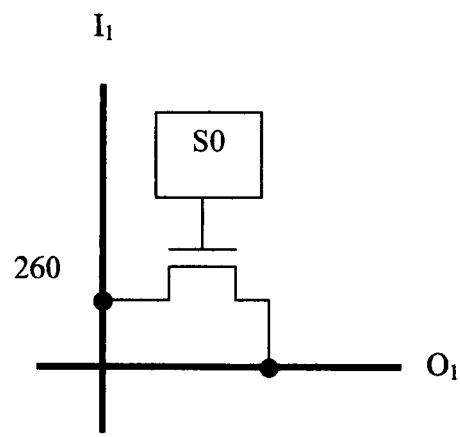
FIG. 9 shows an exemplary pass-gate logic.
Figure 10:
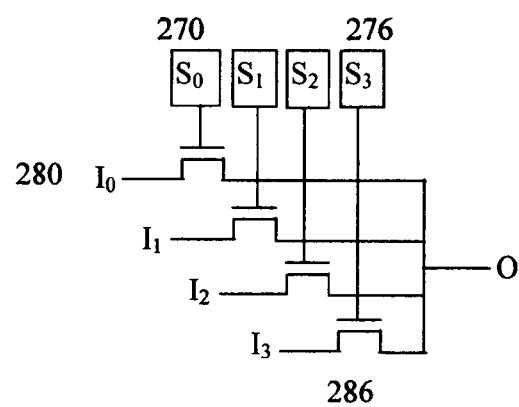
FIG. 10 shows an exemplary 4-Input logic MUX.

FIG. 9 shows an exemplary pass-gate logic 260 connecting one input to one output. The NMOS pass gate voltage level S0 determines an ON and OFF connection. FIG. 10 shows an exemplary 4-Input logic MUX implementing an output function O where O=I0*S0+I1*S1+I2*S2+I3*S3. In the MUX, only one of S0 270, S1 272, S2 274, S3 276 has a logic one. The MUX is constructed by combining four NMOS pass gate logic elements 280-286 shown in FIG. 9.

Figure 11:
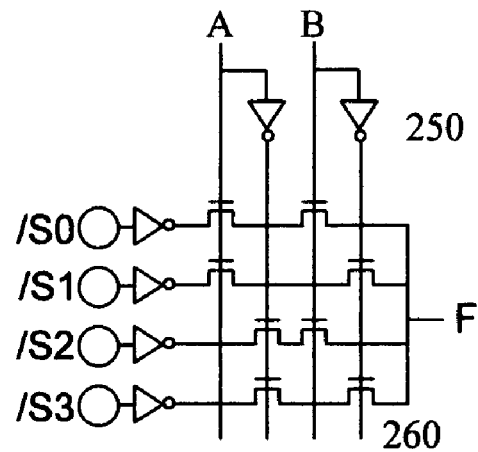
FIG. 11 shows an exemplary 2-Input Truth Table.

FIG. 11 shows an exemplary 2-input truth table logic realization of an output function F where, $$F = /A*/B*S0 + /A*B*S1 + A*/B*S2 + A*B*S3 (/A \text{ means not } A).$$

The truth table logic values are represented by S0, S1, S2 and S3. The realization is done through six inverters collectively designated 250 and eight pass transistors collectively designated 260. Logic values are stored in 4 programmable registers.

Figure 12:
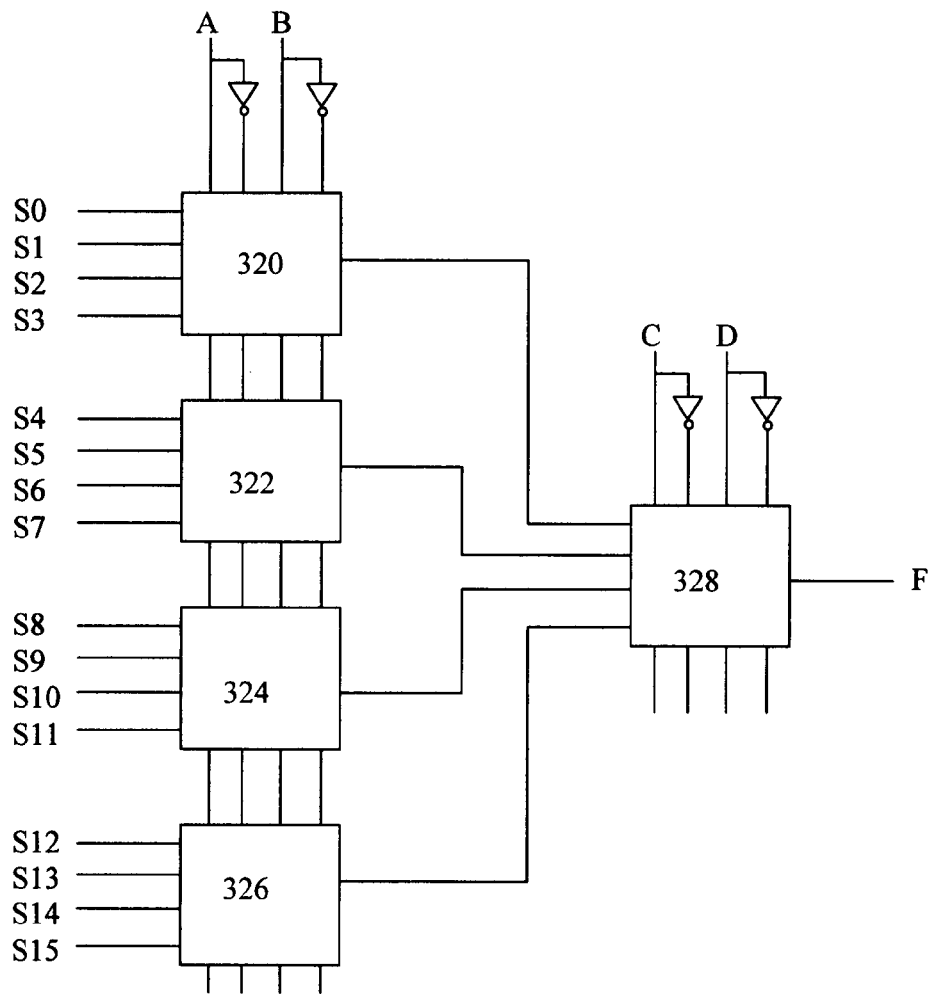
FIG. 12 shows a logic tree implementation of a 4-Input Truth Table.

FIG. 12 shows a logic tree constructed with five 2-input truth table logic blocks 320-328 to perform a full four input truth table. A four input truth table has 16 possible logic values S0, S1, . . . , S15. As the number of inputs grow to N, this logic tree construction requires $2^N$ logic values, and $2^{(N-1)}$ branches in the logic tree. For large N values, a full truth table realization is less efficient compared to a partial product term AND-OR array realization.

In another embodiment, the programmable logic block can be a programmable microprocessor block. The microprocessor can be selected from third party IP cores such as: 8051, Z80, 68000, MIPS, ARM, and PowerPC. These microprocessor architectures include superscalar, Fine Grain Multi-Threading (FGMT) and Simultaneous Multi-Threading (SMT) that support Application Specific Packet Processing (ASPP) routines. To handle Programmable Network Interface (PNI) the processor can contain hardware and software configurability. Hardware upgradeability can be greatly enhanced in microprocessors embedded in PLD's by making use of the available logic content of the PLD device. Programmable features can include varying processor speed, cache memory system and processor configuration, enhancing the degree of Instruction Level Parallelism (ILP), enhancing Thread level parallelism (TLP). Such enhancements allow the user to optimize the core processor to their specific application. Cache parameters such as access latency, memory bandwidth, interleaving and partitioning are also programmable to further optimize processor performance and minimize cache hit miss rates. Additionally, the processor block can be a Very Long Instruction Word (VLIW) processor to handle multimedia applications. The processor block can include a cache controller to implement a large capacity cache as compared with an internal cache.

While a PLD can be configured to do DSP functions, the programmable logic block can also contain a digital signal processor (DSP), which is a special purpose processor designed to optimize performance for very high speed digital signal processing encountered in wireless and fiber-optic networks. The DSP applications can include programmable content for cache partitioning, digital filters, image processing and speech recognition blocks. These real-time DSP applications contain high interrupt rates and intensive numeric computations best handled by hardware blocks. In addition, the applications tend to be intensive in memory access operations, which may require the input and output of large quantities of data. The DSP cache memory may be configured to have a "Harvard" architecture with separate, independent program and data memories so that the two memories may be accessed simultaneously. This architecture permits an instruction and an operand to be fetched from memory in a single clock cycle. A modified Harvard architecture utilizes the program memory for storing both instructions and operands to achieve full memory utilization. The program and data memories are often interconnected with the core processor by separate program and data buses. When both insections and operands (data) are stored in a single program memory, conflicts may arise in fetching data with the next instruction. Such conflicts have been resolved in prior art for DSP's by providing an instruction cache to store conflicting instructions for subsequent program execution.

In yet another embodiment, programmable logic block can contain software programmability. These software functions are executed in DSP, ARM, or MIPS type inserted IP cores, or an external host CPU. Accelerators connected by a configurable SRAM switching matrix enhance the computation power of the processors. The microprocessor has local permanent SRAM memory to swap, read, and write data. The switch matrix is pre-designed to offer both hard-wire and programmable options in the final ASIC. In this situation, the circuit block 104 can be a functional block that performs well-defined, commonly-needed function, such as special D/A or A/D converter, standard bus interface, or such block that implements special algorithms such as MPEG decode. The special algorithms implemented can be hardware versions of software. For example, algorithms relating to digital radio or cellular telephone such as WCDMA signal processing can be implemented by the functional block.

Other functional blocks include PCI, mini-PCI, USB, UART blocks that can be configured by specifying the SRAM logic blocks.

In yet another embodiment, the circuit block 104 can be memory such as a register file, cache memory, static memory, or dynamic memory. A register file is an array of latches that operate at high speed. This register length counter may be programmable by the user. A cache memory has a high access throughput, short access latency and a smaller capacity as compared with main memory. The cache memory may be programmable to partition between the different requirements of the system design. One such need is the division between L1 and L2 cache requirements for networking applications. The memory can also be static random access memory or (SRAM) device with an array of single port, or multi-port addressable memory cells. Each cell includes a four transistor flip-flop and access transistors that are coupled to input/output nodes of the flip-flop. Data is written to the memory cell by applying a high or low logic level to one of the input/output nodes of the flip-flop through one of the access transistors. When the logic level is removed from the access transistor, the flip-flop retains this logic level at the input/output node. Data is read out from the flip-flop by turning on the access transistor. The memory can also be dynamic random access memory (DRAM). Generally, a DRAM cell consists of one transistor and a capacitor. A word line turns on/off the transistor at the time of reading/writing data stored in the capacitor, and the bit line is a data input/output path. DRAM data is destroyed during read, and refresh circuitry is used to continually refresh the data. Due to the low component count per bit, a high density memory device is achieved.

In another embodiment, the circuit block 104 can be an intellectual property ("IP") core which is reusable for licensing from other companies or which is taken from the same/previous design. In core-based design, individual cores may be developed and verified independently as stand-alone modules, particularly when IP core is licensed from external design source. These functions are provided to the user as IP blocks as special hardware blocks or pre-configured programmable logic blocks. The IP blocks connect via a programmable switching matrix to each other and other programmable logic. The hardware logic block insertion to any position in a logic sequence is done through the configurable logic matrix. These hardware logic blocks offer a significant gate count reduction on high gate count frequently used logic functions, and the user does not require generic "logic element" customization. In both cases, the user saves simulation time, minimize logic gate count, improve performance, reduce power consumption and reduce product cost with pre-defined IP blocks. The switch matrix is replaced by hard-wires in the final ASIC.

The circuit blocks 104 can also be an array of programmable analog blocks. In one embodiment, the analog blocks include programmable PLL, DLL, ADC and DAC. In another embodiment, each block contains an operational amplifier, multiple programmable capacitors, and switching arrangements for connecting the capacitors in such as a way as to perform the desired function. Switched capacitor filters can also be used to achieve an accurate filter specification through a ratio of capacitors and an accurate control of the frequency of a sampling clock. Multiple PLL's can be programmed to run at different frequencies on the same chip to facilitate SoC applications requiring more than one clock frequency.

The circuit blocks 104 also contain data fetch and data write circuitry required to configure the configuration circuits 108. This operation may be executed by a host CPU residing in the system, or the PLD device itself. During power up, these circuits initialize and read the configuration data from an outside source, either in serial mode or in parallel mode. The data is stored in a predefined word length locally and written to the configurability allocation. The programmed configuration data is verified against the locally stored data and a programming error flag is generated if there is a mismatch. These circuits are redundant in the conversion of the PLD to an ASIC. However, these circuits are used in both FPGA and ASIC for test purposes, and has no cost penalty. A pin-out option has a "disable" feature to disconnect them for the customer use in the FPGA and ASIC.

Configuration circuits 108 provide active circuit control over digital circuits 104. One embodiment of the configuration circuit includes an array of memory elements. The user configuration of this memory amounts to a specific bitmap of the programmable memory in a software representation.

Suitable memory elements include volatile or non volatile memory elements. In non-volatile memory (NVM) based products, configurable data is held in one of metal link fuse, anti-fuse, EPROM, Flash, EEPROM memory element, or ferro-electric elements. The first two are one time programmable (OTP), while the last four can be programmed multiple times. As EPROM's require UV light to erase data, only Flash & EEPROM's lend to in-system programmability (ISP). In volatile products, the configurable data storage can be SRAM cells or DRAM cells. With DRAM cells, the data requires constant refresh to prevent losses from leakages. Additionally, one or more redundant memory cells controlling the same circuit block can be used to enhance device yield.

The components of the memory element array can be a resistor, capacitor, transistor or a diode. In another embodiment of the configuration circuit, a memory element can be formed using thin film deposition. The memory element can be a thin film resistor, thin film capacitor, thin film transistor (TFT) or a thin film diode or a group of thin film devices connected to form an SRAM cell.

This discussion is mostly on SRAM elements and can easily extend to include all other programmable elements. In all cases, the design needs to adhere to rules that allow programmable module elimination, with no changes to the base die, a concept not used in PLD, FPGA, Gate Array and ASIC products today.

Figure 13:
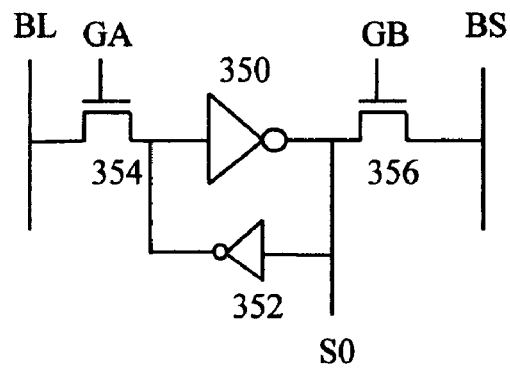
FIG. 13 shows an exemplary 6T SRAM.

An exemplary 6T SRAM cell, shown in FIG. 13, needs no high voltage capability, nor added process complexity. The cell of FIG. 13 has two back-to-back inverters 350-352 whose access is controlled by pass transistors 354-356. In addition, R-load & Thin Film Transistor (TFT) load PMOS based SRAM cells can be used for PLDs and FPGAs. To achieve zero stand-by power by eliminating sensing circuitry, and reduce memory element count for low input functions, these SRAM cells are embedded in truth table logic (also called Look-Up-Table) based architectures.

Figure 14:
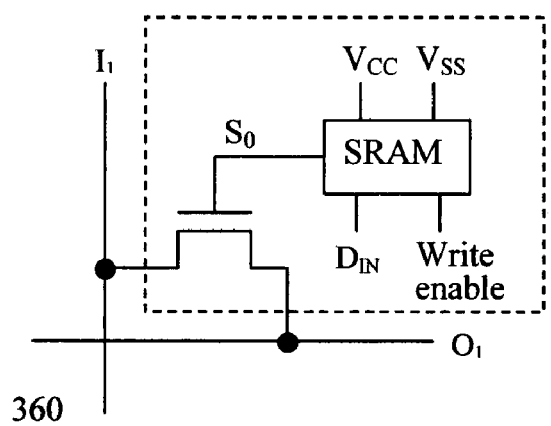
FIG. 14 shows pass gate transistor logic controlled by SRAM.
Figure 15:
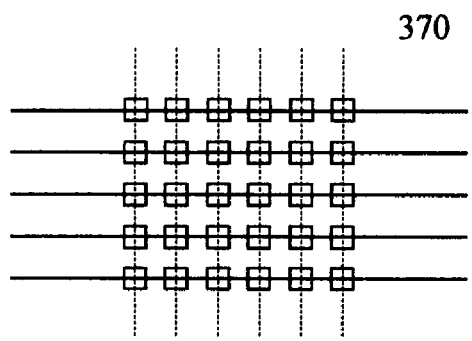
FIG. 15 shows one embodiment of a 5×6 switch matrix.
Figure 16:
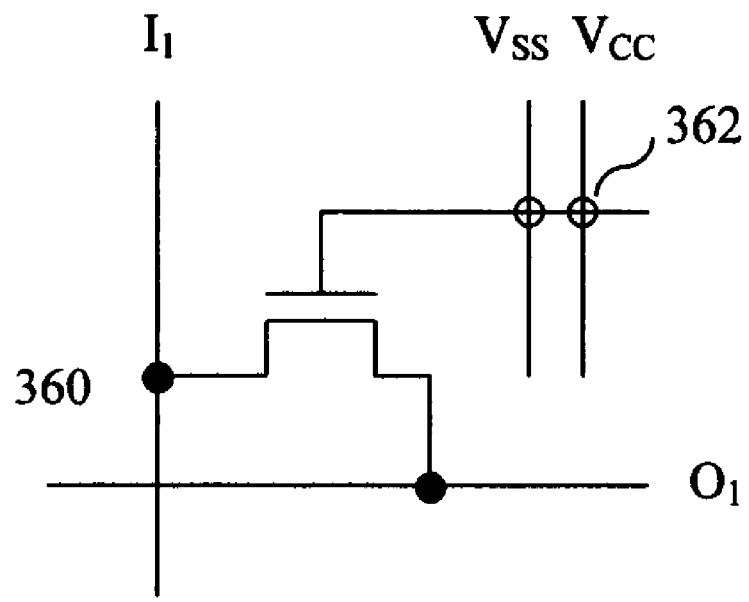
FIG. 16 shows pass gate controlled by Vcc (power) or Vss (ground)

Pass gate transistor 360 logic controlled by SRAM is shown in FIG. 14. In this embodiment, the memory cell (such as the cell of FIG. 13) drives the pass transistor 360 to affect an outcome. A 5×6-switch point matrix 370 controlled by 30-SRAM cells coupled to 30-NMOS pass gates is shown in FIG. 15. FIG. 16 shows the NMOS pass gate 360 logic controlled by the SRAM in FIG. 14 converted to hard-wire logic. A contact 362, connected to Vcc (logic 1) or Vss (logic 0) depending on the SRAM logic content, replace the SRAM cell. The SRAM logic mapping to hard wire connections are automatic and done by a software program that is verifiable against the bit-map.

Figure 17:
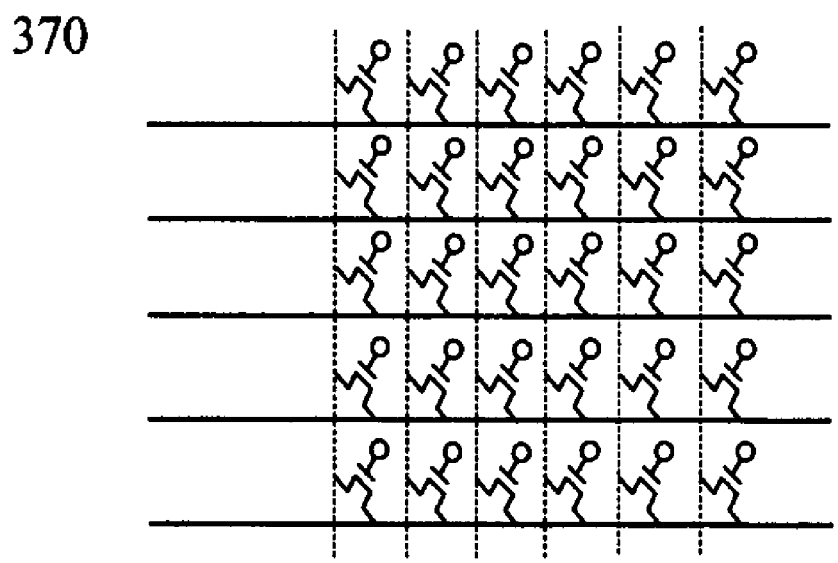
FIG. 17 shows the 5×6 switch matrix

Similarly, FIG. 17 shows the 5×6-switch point matrix 370 hard-wired by replacing the SRAM bits that control NMOS gates with hard-wires to Vcc or Vss. In FIG. 17, the bubble may represent either SRAM or hard-wire Vcc or Vss control on NMOS pass gates. In the case of Fuse or Antifuse arrays, contact or no contact between the two metal lines in FIG. 15 directly replaces the programmable element and there is no NMOS pass-gate needed.

The P-Term logic builds the core of PLD's and complex PLD's (CPLD's) that use AND-OR blocks 202-204 (or equivalent NAND-NOR type logic functions) as shown in the block diagram of FIG. 5 and one expansion is shown in FIG. 6 with AND gates 210 and OR gates 212. Gate implementation of two inputs (I1, I2) and two P-terms (P1, P2) NAND function can be single poly EEPROM bits as shown in FIG. 7. The dotted circle contains the charge trapping floating gate, the programming select transistor, tunneling diode, a control gate capacitor and programming access nodes. The SRAM cell replaces that entire circle in this invention as detailed next. The SRAM NAND-NOR array (also AND-OR array) replacement has not been realized in prior art as SRAM cells require Nwell & Pwell regions that consume large silicon area to prevent latch-up. The SRAM in TFT do not have well related constraints as NMOS and PMOS bodies are isolated from each other. Keeping the two pass gates in silicon layers and moving SRAM to TFT layers allow P-Term logic implementation with SRAM cells and subsequent replacement with hard-wires. In TFT SRAM conversion to final ASIC, the bubble on NMOS gate becomes a hard-wire connection to Vcc or Vss.

The length of input and output wires, and the drive on NMOS pass gates and logic gate delays determine the overall PLD delay timing, independent of the SRAM cell parameters. By moving SRAM cell to TFT upper layers, the chip X,Y dimensions are reduced over 20% to 50% compared to traditional SRAM FPGA's, providing a faster logic evaluation time. In addition, removal of SRAM cell later does not alter lateral wire length, wire loading and NMOS pass gate characteristic. The vertical dimension change in eliminating the memory module is negligible compared to the lateral dimension of the ASIC, and has no impact on timing. This allows maintaining identical timing between the FPGA and ASIC implementations with and without the SRAM cells. The final ASIC with smaller die size and no SRAM elements have superior reliability, similar to an ASIC, leading to lower board level burn-in and field failures compared to PLD's and FPGA's in use today.

Next, the wiring and/or routing circuit 112 is discussed. The wiring and/or routing circuit connects each logic block to each other logic block. The wiring/routing circuit allows a high degree of routing flexibility per silicon area consumed and uniformly fast propagation of signals, including high-fanout signals, throughout the device. The wiring module may contain one or many levels of metal interconnects.

One embodiment of a switch matrix is a 6×5 programmable switch-matrix with 30 SRAM bits (or 30 Anti-fuses, or 30 fuses), shown in FIG. 15. The box in FIG. 14 contains the SRAM cell shown inside dotted box of FIG. 14, where the pass gate makes the connection between the two wires, and the SRAM bit holds the configuration data. In this configuration, the wire connection in circuit 112 occurs via a pass transistor located in circuit 104 controlled by an SRAM cell in circuit 108. During power-up, a permanent non-volatile memory block located in the system, loads the correct configuration data into SRAM cells. In Fuse or Anti-fuse applications, the box simply represents the programmable element in circuit 108 between the two wires in circuit 112. During the ASIC conversion this link is replaced with an open or short between the wires.

Another embodiment provides short interconnect segments that could be joined to each other and to input and output terminals of the logic blocks at programmable interconnection points. In another embodiment, direct connections to adjacent logic blocks can be used to increase speed. For global signals that traverse long distances, longer lines are used. Segmented interconnect structures with routing lines of varied lengths can be used. In yet other embodiments, a hierarchical interconnect structure provides lines of short lengths connectable at boundaries to lines of longer lengths extending between the boundaries, and larger boundaries with lines of even longer length extending between those boundaries. The routing circuit can connect adjacent logic blocks in two different hierarchical blocks differently than adjacent logic blocks in the same hierarchical block. Alternatively, a tile-based interconnect structure can be used where lines of varying lengths in which each tile in a rectangular array may be identical to each other tile. In yet another implementation, the interconnect lines can be separated from the logic block inputs by way of a routing matrix, which gives each interconnect line more flexible access to the logic block inputs. In another embodiment, interconnect routing is driven by programmable buffers. Long wire lengths can be sub-divided into smaller length segments with smaller buffers to achieve a net reduction in the overall wire delay, and to obtain predictable timing in the logic routing of the PLD.

Next, a brief description of the manufacturing process is discussed. During manufacturing, one or more digital circuits can be formed on a substrate. Next, the process selectively fabricates either a memory circuit or a conductive pattern substantially above the digital circuits to control portion of digital circuits. Finally, the process fabricates an interconnect and routing layer substantially above the digital circuits and memory circuits to connect digital circuits and one of the memory circuit or the conductive pattern.

The process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns. The memory circuit and the conductive pattern have one or more substantially matching circuit characteristics. In this case, timing characteristics substantially unchanged by the circuit control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics. In another embodiment, the hard-wire ASIC option may be incorporated into the digital circuit layer 102. In another embodiment, the hard-wire ASIC option is incorporated into the routing layer 110.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A three-dimensional semiconductor device, comprising:
   a programmable logic circuit; and
   a configuration circuit comprising a memory element, wherein:
   the memory element is positioned above or below the logic circuit; and
   the memory element is directly coupled to the logic circuit to program the logic circuit.

2. The device of claim 1, wherein the memory element comprises one or more devices selected from the following: diode, transistor, resistor, capacitor, thin film diode, thin film resistor, thin film capacitor, thin film transistor (TFT).

3. The device of claim 1, wherein the memory element is selected from the group consisting of volatile or non volatile memory elements.

4. The device of claim 1, wherein the memory element is selected from a group of fuse links, antifuse capacitors, SRAM cells, DRAM cells, metal optional links, EPROM cells, EEPROM cells, flash cells, resistance modulating elements, optical elements, charge storage element, voltage modulating element, and ferro-electric elements.

5. The device of claim 1, wherein the configuration circuit further comprises a redundant memory element coupled to the same logic circuit.

6. The device of claim 1, wherein the logic circuit further comprises a redundant logic element coupled to the same memory element.

7. The device of claim 1, wherein the programmable logic circuit responds to input signals and develop corresponding complete or partial output logic signals.

8. The device of claim 1, wherein the programmable logic circuit comprises registers to store output logic signals.

9. The device of claim 8, comprising a clock signal and a control signal.

10. The device of claim 1, wherein the programmable logic circuit comprises one or more of: pass gate logic, multiplexer logic, truth table logic, look up table logic, AND logic, OR logic, arithmetic logic, carry logic, floating point logic, and any other logic.

11. A three-dimensional semiconductor device, comprising:
    a first module layer having a circuit block; and
    a second module layer positioned substantially above or below the first module layer, comprising
    a configuration circuit directly coupled to the circuit block to program the circuit block.

12. The device of claim 11, wherein the configuration circuit comprises a memory element comprising one or more devices selected from the following: diode, transistor, resistor, capacitor, thin film diode, thin film resistor, thin film capacitor, thin film transistor (TFT).

13. The device of claim 12, wherein the memory element is selected from the group consisting of volatile or non volatile memory elements.

14. The device of claim 12, wherein the memory element is selected from a group of fuse links, antifuse capacitors, SRAM cells, DRAM cells, metal optional links, EPROM cells, EEPROM cells, flash cells, resistance modulating elements, optical elements, charge storage element, voltage modulating element, and ferro-electric elements.

15. The device of claim 11, wherein the logic block comprises one or more of:
    pass gate logic, multiplexer logic, truth table logic, look up table logic, AND logic, OR logic, arithmetic logic, carry logic, floating point logic, and any other logic.

16. A three-dimensional semiconductor device, wherein:
    a configurable memory element directly coupled to a programmable logic circuit to program the logic circuit positioned substantially above or below the logic circuit.

17. The device of claim 16, wherein the configurable memory element comprises one or more devices selected from the following: diode, transistor, resistor, capacitor, thin film diode, thin film resistor, thin film capacitor, thin film transistor (TFT).

18. The device of claim 17, wherein the configurable memory element is selected from the group consisting of volatile or non volatile memory elements.

19. The device of claim 17, wherein the configurable memory element is selected from a group of fuse links, antifuse capacitors, SRAM cells, DRAM cells, metal optional links, EPROM cells, EEPROM cells, flash cells, resistance modulating elements, optical elements, charge storage element, voltage modulating element, and ferro-electric elements.

20. The device of claim 16, wherein a said programmable logic circuit comprises one or more of: pass gate logic, multiplexer logic, truth table logic, look up table logic, AND logic, OR logic, arithmetic logic, carry logic, floating point logic, and any other logic.

* * * * *